United States Patent [19]

Lindsay

[11] Patent Number: 4,727,354

[45] Date of Patent: Feb. 23, 1988

[54] SYSTEM FOR SELECTING BEST FIT VECTOR CODE IN VECTOR QUANTIZATION ENCODING

[75] Inventor: Robert A. Lindsay, Bountiful, Utah

[73] Assignee: Unisys Corporation, Detroit, Mich.

[21] Appl. No.: 4,377

[22] Filed: Jan. 7, 1987

[51] Int. Cl.⁴ .............................................. H03M 7/30
[52] U.S. Cl. .............................................. 340/347 DD
[58] Field of Search ................. 340/347 DD; 382/56; 375/122; 381/31, 32

[56] References Cited

U.S. PATENT DOCUMENTS 4,037,226 7/1977 Betts .......................... 340/347 DD
4,606,069 8/1986 Johnsen ................................ 382/56

*Primary Examiner*—Charles D. Miller
*Attorney, Agent, or Firm*—Alfred W. Kozak; Nathan Cass; L. Joseph Marhoefer

[57] ABSTRACT

A system and apparatus for encoding a set of input vector components by initiating a sequential search through a codebook memory to put out a series of associated error code vectors which can be compared in sequence over a period of time in order to select the minimum error code vector (best fit). A clocking-sequencing means enables an output latch to hold (after termination of the sequence period) the index number which represents the particular error code vector presently having the minimum distortion. Each new set of input vector components will be sequenced to search for the minimum error code vector (and index) for that particular set of input vector components.

14 Claims, 3 Drawing Figures

SYSTEM FOR SELECTING BEST FIT VECTOR CODE IN VECTOR QUANTIZATION ENCODING

FIELD OF THE INVENTION

This disclosure relates to the field of data compression whereby vectors can be quantized using an error codebook to select a code vector which best matches an input vector.

BACKGROUND OF THE INVENTION

Presently there is an increasing trend toward the development of data transmission networks which can incorporate digital voice, data, and image information on the same network. These are generally called ISDN or Integrated Services Digital Networks. Since these networks have a limited band width for transmission of information, the available band width must be used as efficiently as possible. For many years, the analysis, modeling, and coding of information to reduce the overall bit rate has been actively studied. In order to achieve the best results different techniques are applied to different types of information. "Vector quantization", is one specific technique that has applications in both voice compression and image compression. Image data is particularly challenging to compress because of the large amount of digital information required to accommodate the human eye. Another variation of vector quantization is often referred to as color/spatial quantization and has been developed to efficiently encode such images as color maps. Vector quantization is not limited to any specific type of data but has applications wherever there is redundant information that can be removed with a lossy compressor.

The primary goal of network services is to allow distributed processing and exchange of information in an environment in which central locations are responsible for maintaining data bases. Networks, such as the telephone system, have been developed for voice transmission. Other types of computer networks operate with digital data and with file transfers. Thus the need for special purpose networks and transmission links will continue to be a rapidly developing subject. The growing trend is to provide and operate integrated networks which carry digital voice data, information data, and image data. These integrated digital networks will provide the basis for efficiently exchanging information and maintaining data bases. Regardless of the size of the network or the type of the information that is being processed, there will always be a need for efficient storage and transmission. Thus the compression of voice data, information data, and image data will be a key technology for ISDN networks.

Many techniques have been developed for the compression of digital, voice, data and images. Each method takes advantage of specific characteristics of the data. Also consideration must be given to the purpose or final use of the data. For example, voice information and image information do not require perfect replication so long as the introduced distortion is not misleading or disturbing to the listener or observer. On the other hand, computer files that even have a single error are possibly no longer of adequate use. When a compression algorithm is able to restore the encoded data to its original form, with no degradation, the algorithm is referred to as a "lossless" data compression technique. Other algorithms that introduce an acceptable amount of distortion are referred to as "lossy" data compression techniques. Thus the requirements of the user will dictate which approach is best suited for compression of the data.

When a compression algorithm is chosen, the advantages of reduced storage and transmission charges must be compared to the cost and complexity of the implementation. Today's hardware operates at higher speeds, allows greater complexity, and is considerably less expensive than ever before. Thus these hardware advances allow complex algorithms to process data before and after storage and transmission. Special purpose hardware also allows algorithms to be directly implemented at reduced costs. Regardless of the approach, compression techniques are continually being reevaluated. However, many algorithms that were not feasible in the past are now realizable.

LOSSY COMPRESSION: Much of the data that is transmitted on an information channel is for use by the human sensory system. Minor alterations or infrequent errors to this data is undetectable or tolerable to human senses. Many compression techniques capitalize on this phenomena. When a technique is able to reduce the data rate and bandwidth required to send the information by controlling the distortion without intolerable changes to the data, it is referred to as lossy compression. Vector quantization is a lossy technique for reducing the amount of information to be transmitted or stored. This is accomplished by removing information that is perceived as useless in the particular application being considered. Presently a considerable amount of anticipation exists because of the gains that are being realized in the area of image compression by using vector quantization. A description of vector quantization and examples as applied to image compression follow.

VECTOR QUANTIZATION: Vector quantization is a technique for mapping vectors from a given vector space into a reduced set of vectors within the original vector space or some other representative vector space. The reduced set of vectors, along with the associated mapping, is chosen to minimize error according to some distortion measure. This representative set of vectors is referred to as a codebook and is stored in a memory table. Efficient transmission of vector quantized data occurs by sending a codebook index location from the memory table, rather than sending the vector itself. The computation required to compute the distortions, thereby finding the codebook entry of minimum distortion, has limited the availability of the technique. Advances in hardware allowing cost-efficient implementations of vector quantization have generated renewed systems of implementation during the last few years.

An optimal vector quantizer is designed around a probability distribution, placing the codevectors in the space according to vector probabilities. Vector probability distributions vary with different data. The LBG algorithm (discussed hereinbelow) uses either a known probability distribution, or trains the codevectors on a select set of training vectors. If the probability distribution is known, the codevectors are placed in the N dimensional vector space according to the probability distribution. Areas of high probability contain a larger population of codevectors; low probability areas contain a sparse population. If the probability distribution is not known, the codevectors are distributed according to a select set of training vectors. Iteratively selecting codevectors to minimize distortion results in a locally optimal set of codevectors. The algorithm guarantees convergence of a local minimum distortion, but not convergence to an absolute minimum for all vectors.

The vector quantization encoding process searches the representative codevectors and replaces the input vector from the data source with an index. The index represents the codebook vector of minimum distance from the incoming vector. Distance between vector and codevector is proportional to the amount of degradation that will occur from vector quantization. Distance is most often measured by using a squared error criterion but many others are discussed in the literature.

Recent developments in vector quantization have shown the technique to be useful for voice and for image compression. Because of advances in hardware which allow cost-efficient implementations, vector quantization methods have been expanded in development.

A fundamental result of rate distortion theory is that better overall compression performance can be achieved when encoding a vector (group of scalars) than when encoding the scalars individually. This development has been presented in an article by R. Gray entitled "Vector Quantization" in the IEEE ASSP magazine, of April 1984. Vector quantization takes advantage of this theory by compressing groups of scalars, and treating each scalar as a vector coefficient. As an image compression scheme, vector quantization has both theoretically and experimentally outperformed methods of image compression using scalar quantization.

Methods of compression attempt to remove redundancies, while causing minimal distortion. Vector quantization uses four properties of vector parameters for redundancy removal, namely: correlation; nonlinear dependency; probability density function; shape and vector dimension. Scalar quantization takes advantage of correlation and probability density function shape only. By using the properties of nonlinear dependencies and vector dimensionality, vector quantization is able to outperform scalar quantization even when compressing totally uncorrelated data and an optimal vector quantizer is designed around a probability distribution, placing the "code vectors" in the space according to vector probabilities. Vector probability distributions vary with different data. For example, in an article in the IEEE Transactions on Communications, January, 1980, entitled "An Algorithm for Vector Quantizer Design" by Y. Linde, R. Gray, and A. Buzo, there was developed an algorithm designated as the "LBG" algorithm which uses either a known probability distribution or trains the code vectors on a select set of training vectors. If the probability distribution is known, the code vectors are placed in the N dimensional vector space according to the probability distribution. Areas of high probability contain a larger population of code vectors; but low probability areas contain a sparse population. If the probability distribution is not known, the code vectors are distributed according to a select set of "training vectors". Iteratively selecting code vectors, that minimize distortion caused by encoding the training vectors, results in a "locally optimal set" of code vectors. The algorithm guarantees convergence of a local minimum distortion, but not convergence to an absolute minimum for all vectors of the training sequence.

The "vector quantization encoding process" operates to match a representative code vector with each input vector. The code vector that is the minimum distance from the incoming vector, is chosen as the representative code vector. The distance between the incoming vector and the code vector is proportional to the amount of degradation that will occur from vector quantization. This distance is measured by finding the Euclidian distance between the incoming vectors and code vectors. The Euclidian distances are then measured using a means squared error distortion formula as follows:

$$d(x,y) = \text{Summation over the vector length} \ (x_i - y_i)^2$$

Where $x_i$ is the image vector coefficient and $Y_i$ is the code vector coefficient. By minimizing the term $d(x,y)$ over all of the code vectors, this will cause the selection of the "closest" code vector, and thus gives the best possible match between the incoming vector and the code vector.

By representing this larger set of incoming vectors with a smaller subset of code vectors, enables a reduction in the amount of information required. The rate of compression realized is a function of the vector dimension $X,^r$ the code vector subset size $L,(2^k)$ and the scalar size $k(2^8)$.

SUMMARY OF THE INVENTION

The present invention involves the use of a predefined codebook which has $2^k$ vectors of dimensions "r" where $2^k$ represents the number of tree branches in the codebook. The system features provision for finding of the "best fit" vector of dimension "r" from the predefined codebook. "Best fit" represents the vector which provides the least distortion, where the measure of distortion is predetermined by the user and is independent of the hardware. By making a calculation of the error deviation (distortion) between each input vector and each codebook vector, it is possible to find the closest or best fit codebook vector which matches the input vector.

It is necessary in this situation to calculate the differences or "distortion" between each of the input vectors under consideration and each of the residing codebook vectors in memory in order to determine which codebook vector most closely matches any given input vector.

The present system eliminates the need to perform these calculations in expensive and complex hardware; rather instead, all of the component error terms for all of the possible input vector components are precalculated and stored in a memory arrangement.

The memory arrangement for the error codebook uses an architecture by which a sequence operated by a clock-counter outputs the code vector component according to the index of the sequencer.

The memory arrangement provides for "r" memories where r is the number of input vector components and each memory simultaneously provides an error code to a summation means, which error code (for that set of input vector components) is latched into a first input latch means. A counter means sequences a search of each memory to provide another error code to the first input latch means.

Then a comparison-selection means operates to compare each subsequent output error code against the previous error code so that the first input latch means will retain the lower value of any two compared error codes. A second output latch means will hold the Index number of that error code which was the smallest (minimum) value of the sequenced set of comparisons.

DESCRIPTION OF PREFERRED EMBODIMENT

Figure 1:
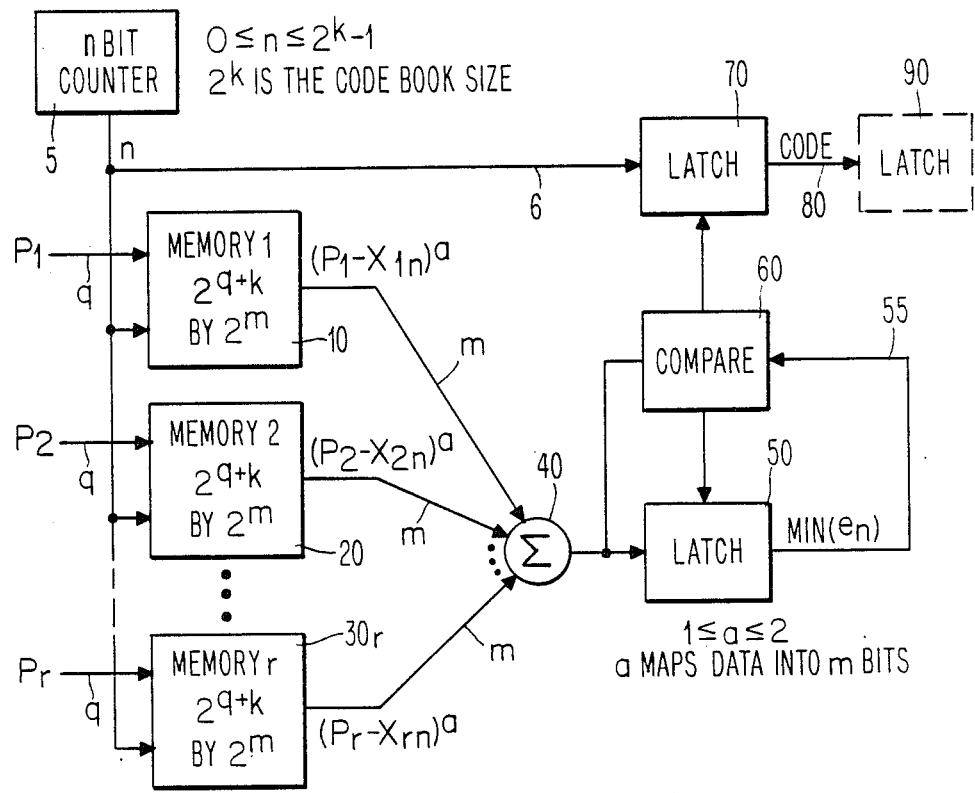
FIG. 1 is a block diagram of the basic elements of the best fit selection system for encoding input vectors using the error codebook to provide an output code symbol or index for transmission on a data link.

As shown in FIG. 1, there is presented a diagram of the system whereby a series of vector components $P_1$, $P_2$, ... $P_r$ (previously quantized to "q" bits of scalar information) present a series of input information into a codebook memory system which permits a comparison selection means to select the best fit code index 80 which can be transmitted on a data link to a decoder which will replace the index with a vector from a codebook.

Here is seen a plurality of memory storage devices which go to form the codebook which provides code vectors whereby each code vector is designated with information which shows how much distortion or error deviation occurs between the input vector component information and the output code vector from each memory.

For example, pixel information of 8 bits may be fed at input $P_1$; likewise another pixel information data of 8 bits may be fed into input $P_2$ and so on until final pixel information of 8 bits may be fed into the input $P_r$.

Each vector component input $P_1$, $P_2$, ... $P_r$ is fed to its own individual memory codebook unit where, as seen in FIG. 1, each codebook memory unit has a length of $2^{q+k}$ and a memory width of $2^m$ bits.

Here the symbol "q" represents the number of input bits of information for each of the input vector lines. For example, if 8 bits of information are provided on the input line $P_1$, then the value of q is equal to 8.

The symbol "k" represents a number for denoting memory size since memories are manufactured on number sizes based on "2".

The symbol "m" represents the number of output bits which are released from the memories. Thus, if the code vector output provides a signal of 4 bits then m is equal to 4. And thus, similarly the $2^m$ memory width would be equal to $2^4$ which would be 16 ERROR DEVIATIONS.

The size of the codebook would be represented by $2^k$. Thus if k is equal to 4, then $2^4$ would be equal to 16 and the codebook would provide a tree of 16 branches. To put it another way, there would be 16 separate branchings in the tree for searching to provide a selected codebook vector. Codebook sizes that are greater than $2^{k-1}$ and less than $2^k$ are considered special cases of codebook size $2^k$ where some vector components would be repeated or nullified.

Situated within each memory is a series of data involving precalculated error functions (deviations). Thus for each code vector in the memory which is selected by the input component, there will be provided an output which places a value on the amount of deviation between the input vector component and the selected code vector. This "error deviation" is designated (for input vector component $P_1$) as:

$$(p_1 - x_{ln})^a.$$

Likewise the "error deviation" between input component $P_r$ and the code vector selected from the memory $30_r$ will be seen to be shown as:

$$(P_r - x_{rn})^a.$$

Thus each of the code vector memories 10, 20, ... $30_r$ provide data in the form of "m" bits which represent the error deviation for each input vector component and the corresponding code vector selected from that memory. The element "a" is chosen such that it provides the most efficient use of the output configuration of the memory.

As seen in FIG. 1, there is provided a counter 5 designated as a "n bit counter" where the number n represents the number of search branches that are sequenced in the memory in order to derive the vector code information. Symbol "n" will vary from 0 up to $2^{k-1}$ which would indicate that at its maximum usage the presearch sequence could step through 16 branches in the tree search. In the special case where the codebook is greater than $2^{k-1}$ and less than $2^k$, the counter would require reset at the codebook size with additional circuitry.

The counter 5 thus provides a count of the code index which is derived from each branch of the tree search code.

For each count of the counter 5 there is provided a simultaneous output data from each of the codebook memories which are inserted into the summation circuit means 40. The summation circuit means 40 provides a code vector error function for each count of the counter, that is to say, for each search step through the tree search sequence.

Each output step of the search sequence is conveyed to the latch 50 and to the comparison circuit 60 whereby a comparison may be made to select the particular step "n" which provided the minimal error function. After stepping through the $2^k$ steps of the tree search sequence, the comparison circuit 60 can select the lowest minimal error function and latch the code index in the latch 70 which represents that particular code vector which provided the minimum error function.

Then this code vector from latch 70 can be conveyed as a code index 80 on a data link to a decoding device at a remote location.

Figure 2B:
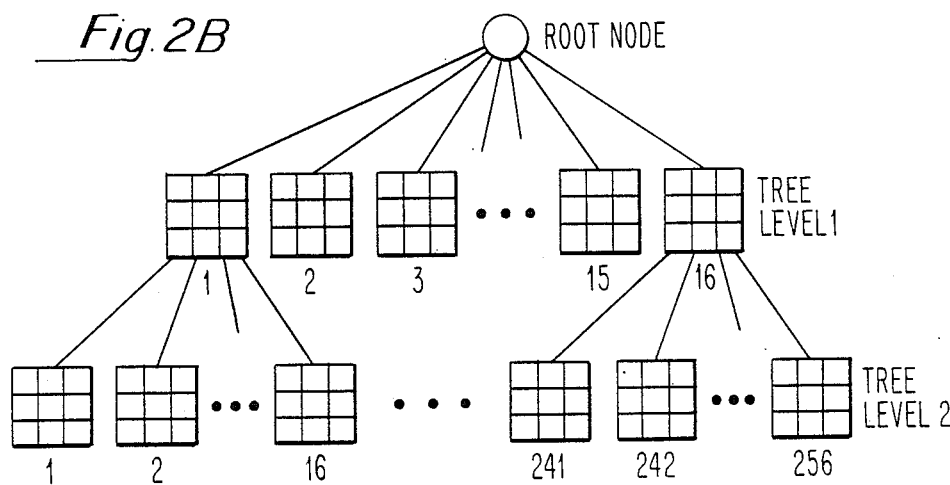
FIG. 2B illustrates a multiple level codebook tree structure indicating how a search is made through each level to find the codebook vector block which most closely matches the input vector block.
Figure 2A:
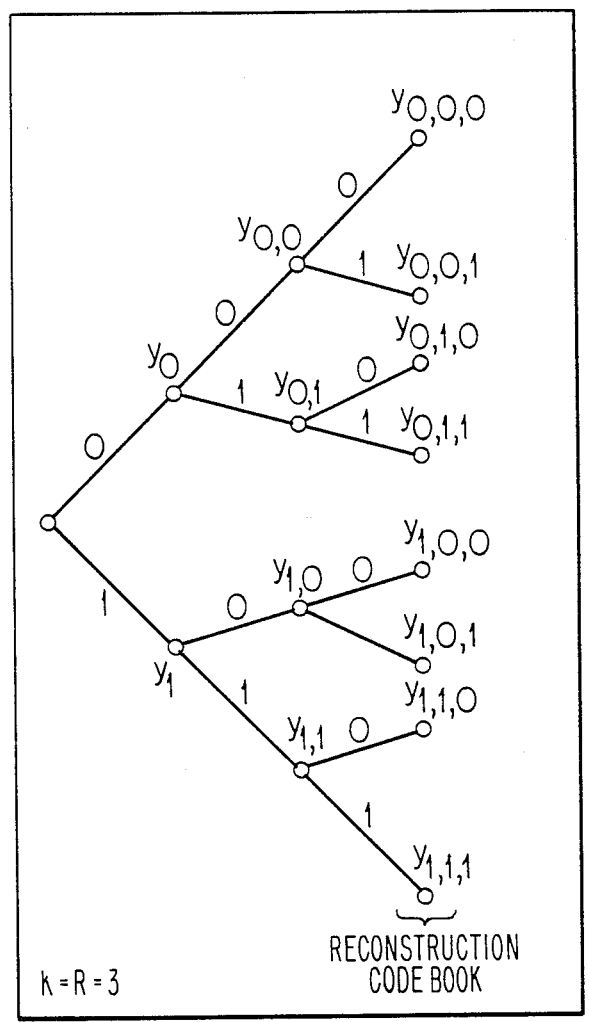
FIG. 2A shows a simple illustration of a tree search codebook where each node represents a different level of refinement in a digital sense.

FIG. 2A is a schematic illustration of how the system may be used for tree search architectures. For example, at the first level, the codebook vector may be a $y_0$ or $y_1$. Then at the next search level the codebook vector may be $y_{0,0}$ or $y_{0,1}$. On the same branch of this code vector group, the code vector may be $y_{1,0}$ or $y_{1,1}$. Now stepping down further in the branch level, it is seen that at the third branch level, the code vector may be either $y_{0,0,0}$ or $y_{0,0,1}$ or $y_{0,1,0}$ or $y_{0,1,1}$. Likewise on the other branch at the same level, the codebook vector may be $y_{1,0,0}$ or $y_{1,0,1}$ or $y_{1,1,0}$ or $y_{1,1,1}$.

This tree is referred to as a "binary tree" since each level has two branches. Implementation of this binary tree requires three encoders, with k=1.

Using the example shown in FIG. 2B, it can then be seen that the codebook tree structure of multiple levels can be made using larger encoders. For instance, at tree level 1 there might be 16 vector quantities and at tree level 2 there may be as many as 256 vector quantities. This structure could be developed to add further levels with greater refinement.

The architectural system using the precalculated memory and the latch compare selection circuitry serves the purpose of finding the best fit vector of dimensions from a predefined codebook of $2^k$ vectors of dimensions. These codebook vectors are designed by a vector quantization algorithm for codebook design. There are many different types of algorithms for developing a codebook design, however, the best fit vector is here defined as the minimum error deviation, $e_n$, where:

$$e_n = \sum_{i=1}^{r} (P_i - X_{ni})^a \quad \text{typically } 1 \leq a \leq z$$

$P_i$ represents the vector component (or one of the vector components) such as were earlier designated as $P_1$, $P_2$, etc.

The symbol $X_{ni}$ represents the codebook vector at the nth level of the tree search for that particular input vector component designated as $P_i$.

The symbol "r" represents a total number of input vector components such as would be covered from the inputs $P_1$ through and up to $P_r$.

The symbol "a" represents a number between 1 and 2 and is generally equal to the number 2 where it follows the formula of error deviations using the least mean square function.

While previously it was necessary to use large amounts of expensive hardware to perform the entire calculations required necessary to calculate all the error measurements for the code vectors stored in memory in addition to requiring all the extra time needed to do these calculations, however with the provision of precalculated component error terms for all of the possible input vector components being stored in memory, it is a quick and simple task to make use of these precalculated component error terms and to proceed through the sequence to select that codebook vector which provides the least distortion or the minimum error function term (index) which can then be transmitted over a data link to a decoder receiver unit for replication.

There has been described herein an vector quantizer encoder system which uses a precalculated error codebook system whereby a code vector which presents the minimal distortion or minimal error function can be selected after a codebook tree search to provide an output code index which can be transmitted on a data link for replication by a remote decoder-receiver. The previous need for expensive calculator circuitry and time consuming calculations have now been eliminated, and a rapid inexpensive system has been provided whereby data compression code indices can be sent over a data link to a remote unit for replication in relatively accurate fashion with minimal distortion and with advantageous savings through the use of data compression methods which require simpler and much less expensive bandwidth requirements for line transmission.

While the above described system for selecting the best fit vector in a codebook which most closely matches the input vector has been described in one embodiment, there may be provided other functional architectures for the speedy and efficient dispatch of code index vectors to a remote receiver unit. However, it should be understood that other variations of the above described invention may be implemented but which still fall within the framework of the attached claims.

What is claimed is:

1. A system for deriving the best fit codebook vector associated with an input vector having "r" dimensions (input vector components) comprising, in combination:
   (a) memory means for storing codebook vectors wherein each particular codebook vector includes precalculated error data representing the error between each possible input vector component and said each particular codebook vector, said memory means receiving said "r" input vector components;
   (b) sequencing means for effectuating an index search of said memory means to develop a series of n vector component error signals where each error signal represents the difference between the indexed codebook vector and the input vector;
   (c) comparison-selection means for comparing each presently indexed vector component error signal with the previously indexed error signal to latch the smaller-valued of minimal error signal in a latching means during the period of the said index search said comparison-selection means including:
      (c1) latching means for holding the said minimal valued error signal after each index search of said sequencing means and for latching the count number of that index search which corresponds to the minimal valued error signal which occurred during the search sequence.

2. The system of claim 1 wherein said memory means includes:
   (a) a plurality of "r" memories wherein each memory receives a separate input vector component, and each memory outputs a vector component error signal for each index search of said memory means; and
   (b) summation means for simultaneously adding together each memory output of each one of said "r" memories for each index search and operating to provide a summed error signal value, for each index search, to said comparison-selection means.

3. The system of claim 1 wherein said sequencing means includes:
   (a) clock-counter means for generating sequence-step signals to said memory means for enabling each index search, and to said latching means for latching the count number of that index search which established the minimal valued error signal during that index search sequence.

4. The system of claim 1 wherein said comparison-selection means includes:
   (a) means for generating an index signal to a remote decoder unit which would enable said decoder unit to replicate the codebook vector, of an input vector, which provided the minimal error deviation from said input vector.

5. The system of claim 1 wherein said comparison-selection means includes:
   (a) a first input latch for receiving each total error signal from each index search and transmitting that signal to a compare circuit;
   (b) a compare circuit for comparing each presently indexed total error signal with previously indexed total error signals to latch the smaller valued signal in said first input latch;

(c) a second output latch connected to said sequencing means to latch the count n of the index search which represents the minimal total error signal of the sequence of total error signals generated during the n indexed searches.

6. Apparatus for determining which codebook vector in a codebook most closely approximates an input vector, said apparatus comprising:
(a) memory means having "r" memory units, where "r" is the dimensionality of the input vector, for storing sub-sized codebook vectors which include precalculated error data for each of said vectors which represent error deviation between each said sub-sized codebook vectors and each possible input vector, said memory means including receiving means for receiving an input vector;
(b) sequencing means for providing an index search of said memory means for each said input vector to provide an output signal for each index search during a series of n index searches where n is a number equal or greater than "O" and equal to or less than $2^{k-1}$ where k is a whole number, said output signal representing the precalculated error data for a given codebook vector in a given index search;
(c) summation means for adding the outputs of each one of said "r" memory units after each index search to establish the total error deviation on each index search;
(d) comparison-selection means to receive n series of total error deviations during said n index searches and to select that particular total error deviation which presented the minimal error value.

7. The apparatus of claim 6 wherein each of said "r" memory units receives one input vector component of a given input vector where said input vector has "r" input vector components.

8. The apparatus of claim 6 wherein said sequencing means includes:
(a) clock generation means to step each said memory unit through a series of n index searches and to step a second output latch means;
(b) said second output latch means operating to hold the particular step count number which represents that index search step which resulted in the minimal total error deviation;
(c) counting means connected to said clock generation means to count each clock-step initiated by said clock generation means.

9. The apparatus of claim 8 wherein said comparison selection means includes:
(a) a first input latch means for receiving said series of n total error deviations resulting from each index search which was summated by said summation means; said first input latch means operating to store the lesser-valued total error deviation resulting from a compare circuit unit which compares the presently existing total error deviation with any priorly determined minimal total error deviation;
(b) said compare circuit unit for comparing each newly received total error deviation value with any prior minimal total error deviation value to select a final minimal total error deviation value which is latched in said first input latch means, said compare circuit unit including:

(b1) means to latch a particular step count in said second input latch means which corresponds to the most minimal total error deviation value which occurred in a sequence of n step index searches.

10. An apparatus for selecting the best fit codebook vector to an input vector comprising:
(a) means to search through codebook vectors in a memory means, said search providing a series of n search steps wherein each search step generates a total error deviation signal to a determination means;
(b) said memory means holding a plurality of said codebook vectors where each codebook vector includes precalculated error deviation data between each said codebook vector and all possible input vectors;
(c) said determination means operating to select the minimal-valued total error deviation signal which occured in said series of n search steps.

11. Apparatus for compressing input vector data through use of a vector codebook by selecting a codebook symbol "n" representing the vector having the closest match to said input vector by a predetermined distortion measure, said apparatus comprising:
(a) memory means having a table of codebook vectors (X) defined by a vector-quantization algorithm, said memory means including:
(a1) "r" tables of component error terms $(P_i - X_{ni})$ for all possible input vectors, said error terms showing the distortion between each possible input vector component $(P_i)$ and each code vector component $(X_{ni})$;
(a2) means to output a plurality of specific error-terms, one for each input vector component, to a summation circuit means;
(b) summation circuit means for adding said plurality of output component error terms and providing a summation output signal which represents a vector error signal, to a comparison-selection means;
(c) comparison-selection means for selecting the codebook vector index "n" representing the closest vector (least distortion) to the original input vector.

12. An encoder apparatus for vector quantization encoding for selecting a codebook vector index which most closely matches, by a predefined distortion measure, an input vector, comprising, in combination:
(a) a memory means including a plurality of "r" memories wherein each one of said "r" memories receives an input of one vector-component of a multidimensional vector, each of said "r" memories including:
(a1) a codebook of $2^k$ of precalculated component error terms for all possible input vector components to that memory, where $2^k$ equals the number of vector codebook entries;
(a2) said error terms having been calculated by the least means squares method formula;
(a3) means to output a component error signal to a summation device means;
(b) clock timing means for sequencing said memory means in a search mode to find the closest matching codebook vector signal;
(c) said summation device means for receiving and summing each component error signal from each of said memories for each of said clock sequences to provide a vector error signal for each index;

(d) a comparison-selection means for receiving each vector error signal for each clock sequence, and selecting that vector error signal for that particular clock sequence which represents the best fit to the input vector.

13. An operating system for a vector quantizer encoder comprising:
   (a) a plurality of "r" memories wherein each memory receives an input vector-component of a vector having "r" components, each of said memories including:
      (a1) a codebook component memory having pre-calculated error measurement data which stores the distortion error for each possible input vector component for each possible vector codebook component signal from said memory, said memory transmitting a component error signal of "m" bits to a summation means;
   (b) summation means for simultaneously adding up said component error signals from each of said "r" memories for each set of provided input vector components in a given index number;
   (c) counting-indexing means to establish a sequence of indices of periods where there is counted one index count per time period to provide searching indices of each codebook component and each output code word to a latching means;
   (d) means to compare each vector error signal for each index number with the previously latched minimum error signals of each set of minimum error signals to establish a new vector error minimum signal and associated index number "n".

14. A method for operation of a vector quantizer encoder comprising the steps of:
   (a) inputting a set of "r" input vector component signals into a set of "r" memory units; said "r" memory units, said error data representing the error (distortion) between each possible input vector component signal and each one of a set of codebook vectors defined by a vector quantization codebook design algorithm;
   (c) sequencing each codebook vector component of said "r" memory units simultaneously to operate as a search index of a vector codebook wherein each of said "r" memory units outputs a vector component error signal representing a given codebook index;
   (d) summing the vector component error signals to provide the total vector error for a given codebook index;
   (e) comparing the previously latched minimum (distortion) error signal with the presently indexed error signal, and providing clock pulses to first and second latches if the presently indexed error signal is smaller than the previously latched minimum error signal;
   (f) latching into said first latch, the new minimum error signal if it is smaller than the previously latched error signal;
   (g) latching, into said second latch, a new index code associated with the presently latched minimum error signal in said first latch which represents the index of the vector codebook entry presently being read.

* * * * *